United States Patent [19]
Davis

[11] Patent Number: 5,966,645
[45] Date of Patent: Oct. 12, 1999

[54] TRANSMITTER WITH LOW-LEVEL MODULATION AND MINIMAL HARMONIC EMISSIONS

[75] Inventor: Michael D. Davis, Quincy, Ill.

[73] Assignee: Garmin Corporation, Taiwan

[21] Appl. No.: 08/868,008

[22] Filed: Jun. 3, 1997

[51] Int. Cl.[6] .................................................. H03C 1/52
[52] U.S. Cl. ......................... 455/108; 375/295; 375/300
[58] Field of Search .................................... 455/110, 108, 455/72, 118, 127, 114, 126, 116, 115; 332/117; 375/296, 300

[56] References Cited

U.S. PATENT DOCUMENTS

| | | | |
|---|---|---|---|
| 3,681,697 | 8/1972 | Moroney | 325/446 |
| 4,059,727 | 11/1977 | Kingswell et al. | 379/106.08 |
| 4,080,571 | 3/1978 | Weisbrod | 324/767 |
| 4,203,070 | 5/1980 | Bowles et al. | 375/1 |
| 4,232,395 | 11/1980 | Yokogawa | 455/173 |
| 4,247,939 | 1/1981 | Stromswold et al. | 375/1 |
| 4,362,999 | 12/1982 | Sauer | 329/346 |
| 4,384,357 | 5/1983 | deBuda et al. | 375/81 |
| 4,429,418 | 1/1984 | Hooper | 455/314 |
| 4,531,236 | 7/1985 | Ishihara | 455/302 |
| 4,551,854 | 11/1985 | Rutty et al. | 455/78 |
| 4,580,289 | 4/1986 | Enderby | 455/314 |
| 4,627,100 | 12/1986 | Takano | 455/160 |
| 4,645,148 | 2/1987 | Kolkman | 246/34 A |
| 4,921,467 | 5/1990 | Lax | 455/264 |
| 5,111,065 | 5/1992 | Roberge | 327/109 |
| 5,307,515 | 4/1994 | Kuo et al. | 455/295 |
| 5,329,546 | 7/1994 | Lee | 375/1 |

*Primary Examiner*—Wellington Chin
*Assistant Examiner*—Congvan Tran
*Attorney, Agent, or Firm*—Shook, Hardy & Bacon LLP

[57] ABSTRACT

An AM radio transmitter utilizes a push-pull MOSFET based design that rejects even-ordered harmonics, and therefore produces minimal electromagnetic radiation. The transmitter contains a low level modulating circuit and a feedback modulation arrangement which linearizes the modulation of the transmitter, and also senses reverse power in the transmitter antenna line, so that the power and modulation can be reduced if the transmitter has a less than optimal load condition existing on an antenna port. A unique modulation amplifier utilizes a Darlington RF pair having an input stage including the collector of the first transistor of the pair, and a pin diode connected to the base of the first transistor of the pair. A radio signal is modulated by varying a voltage on the collector of the input stage, and simultaneously maintaining a constant voltage at an output stage of the Darlington RF transistor pair. Additionally, a bias of the pin diode is simultaneously varied by the audio signal, thereby changing attenuation characteristics of the radio signal.

13 Claims, 3 Drawing Sheets

5,966,645

TRANSMITTER WITH LOW-LEVEL MODULATION AND MINIMAL HARMONIC EMISSIONS

BACKGROUND OF THE INVENTION

1. Field of the Invention

The present invention is directed generally to an AM radio transmitter. More particularly, the present invention is directed to a VHF band AM radio transmitter of the type utilized for general aviation purposes. More specifically, the present invention is directed to a unique AM radio transmitter having an electrical configuration that produces an extremely low order of harmonics.

2. Description of the Related Art

AM radio transmitters are widely used in the aviation industry as communication devices. These devices have a microphone input, processing circuitry, and an antenna output. An operator, such as a pilot or navigator, speaks into a microphone and an audio signal, indicative of the input voice is generated, modulated onto an RF carrier, amplified and output through the antenna. Traditionally, transmitters for the aviation market are constructed with Class C bipolar transmitters. Conventional AM radio transmitters utilized in the aviation industry have a high order of harmonic emissions. These emissions radiate from the antenna port of the transmitters, as well as in a general fashion off of the transmitter device itself.

Specifically, many conventional AM radio transmitters for the aviation industry utilize what is known as a high level modulation for the collector of the final device in the transmitter stream. In these devices, a power supply voltage is actually modulated to modulate the AM radio signal.

The high order of harmonic emission associated with conventional prior art devices is undesirable. In order to reduce the harmonic emissions, complex and expensive filter units must be employed. Additionally, these filtering units are not altogether effective, resulting in the prior art devices having poor electromagnetic characteristics, both from their antenna ports, and radiating off the devices themselves.

Accordingly, the need exists for a simple solution to the problem of high order harmonic emissions from an AM radio transmitter. Particularly, the need exists for an efficient AM transmitting device which has a low order of harmonic emissions. The present invention overcomes the drawbacks of the prior art, and fills these and other needs.

SUMMARY OF THE INVENTION

It is an object of the present invention to provide an AM radio transmitter that produces a low order of harmonics.

It is another object of the present invention to provide a simple and efficient AM radio transmission device.

These and other objects are achieved by a VHF general aviation communication AM radio transmitter, designed to operate in a frequency range of approximately 118–137 MHz. The AM radio transmitter does not utilize Class C bipolar transmitters, nor a high level modulator for modulating the collector of the final device in a transmitter stream, as in prior art devices. Rather, the audio transmitter of the present invention utilizes a push-pull MOSFET base design, resulting in a lower than typical even-ordered harmonic emission out the antenna of the device. Additionally, the AM radio transmitter of the present invention includes a low level modulating circuit and a feedback modulator which linearizes the modulation in the transmitter, and also sense reverse power in the transmitter antenna line. This construction permits the power and modulation of the transmitter to be reduced if a less than optimal load condition exists on the antenna port of the device.

Particularly, the AM radio transmitter of the present invention has a microphone input for input of audio by an operator, such as a pilot or navigator. An audio signal, indicative of the audio input into the microphone input, passes through a compressor circuit. The compressor circuit serves to maintain a constant audio output level from the compressor circuit, regardless of the amplitude of the signal entered at the microphone input. The compressor circuit is connected to the input of a modulator loop filter. Specifically, the compressor circuit is connected to a differential amplifier in the modulator loop filter. The output of the differential amplifier is connected to a comparator, which is also a part of the modulator loop filter. The output of the comparator is connected to a modulation amplifier, such that the audio signal exits the comparator and enters the modulation amplifier. A phase lock loop synthesizer is coupled through a buffer amplifier into the modulation amplifier, as well.

In accordance with an aspect of the present invention, of the modulation amplifier includes a Darlington configuration formed of a Darlington RF transistor pair. The Darlington RF transistor pair has an input stage, including a collector, and an output stage. In accordance with an aspect of the invention, the collector voltage on the input stage of the Darlington is varied, while the output stage of the Darlington voltage is held constant. Additionally, the input stage of the Darlington RF transistor pair has an input pin diode having a bias. The bias of the input pin diode is varied with the same audio signal to simultaneously change the various attenuation characteristics of the signal.

The modulation amplifier outputs into a driver amplifier, which in turn outputs to a splitter for splitting the AM radio signal. The splitter outputs into a push-pull final amplifier, utilizing power MOSFETS. The utilization of MOSFETS in the final amplifier stage provides even-ordered harmonic rejection, thus resulting in a very low order of harmonic emissions from the AM radio transmitter. The push-pull final amplifier outputs into a combiner wherein the AM radio signal is again combined to a single signal. The combiner outputs into a directional coupler. The directional coupler has a forward power connection connected to a first detector, and a reverse power connection connected to a second detector. The first detector is connected into an input of the modulator loop filter and, specifically, to the comparator. The second detector is connected to another input of the modulator loop filter and, specifically, to the differential amplifier. The directional coupler has an antenna output which passes through a harmonic filter to an antenna.

In operation of the AM radio transmitter of the present invention, an operator, such as a pilot or navigator, inputs voice audio into the microphone input. A signal indicative of the voice audio input through the microphone input is passed through the compressor circuit to maintain the audio at a constant level, regardless of the microphone amplitude. The audio signal enters into the modulator loop filter and, particularly, into the differential amplifier thereof. The differential amplifier buffers the audio input and, additionally, subtracts off of the audio signal any audio detected on the reverse power port of the directional coupler. At the comparator stage, the comparator compares the algebraic difference between the microphone audio input and any audio that has been detected from the first detector, which is fed from the forward power port of the directional coupler. The modulator loop filter of the present invention makes any necessary corrections on the output of the comparator, and feeds the audio signal back into the modulation signal amplifier.

The RF source for the modulation amplifier is supplied by the phase lock loop synthesizer, through the buffer amplifier. The AM modulated output signal from the modulation amplifier is input into the driver amplifier. The AM radio signal is output from the driver amplifier into the power splitter. From the power splitter, the AM radio signal is input into the push-pull final amplifying stage at the final amplifier. The push-pull final amplifier stage rejects even ordered harmonics, thereby producing minimal harmonics when compared with prior art devices. The signals output from the push-pull final amplifier are recombined in a transmission line combiner which combines the two balanced outputs from the push-pull final amplifier into a single unbalanced output. The single unbalanced output signal from the combiner is then input into the directional coupler, which senses the forward power coming out of the transmitter and any reverse power that is reflected back into the transmitter due to a poorly mismatched antenna load.

Any reverse power detected by the second detector is input into the differential amplifier of the modulator loop filter. In accordance with an aspect of the present invention, in the event the reverse power exceeds a selected amount, the actual power modulation of the transmitter is cut back to prevent unstable operation of the final amplifier stage due to a mismatched load at the antenna port, as well as to prevent damage of the electrical components. The antenna output of the directional coupler, which comprises the main transmitter power, passes through the harmonic filter. The harmonic filter further reduces any harmonic levels from the transmitter in the AM radio signal. The AM radio signal is then finally conducted from the harmonic filter out through the antenna.

BRIEF DESCRIPTION OF THE DRAWINGS

The objects and features of the invention noted above are explained in more detail with reference to the drawings, in which like reference numerals denote like elements, and in which.

DETAILED DESCRIPTION OF THE INVENTION

Figure 1:
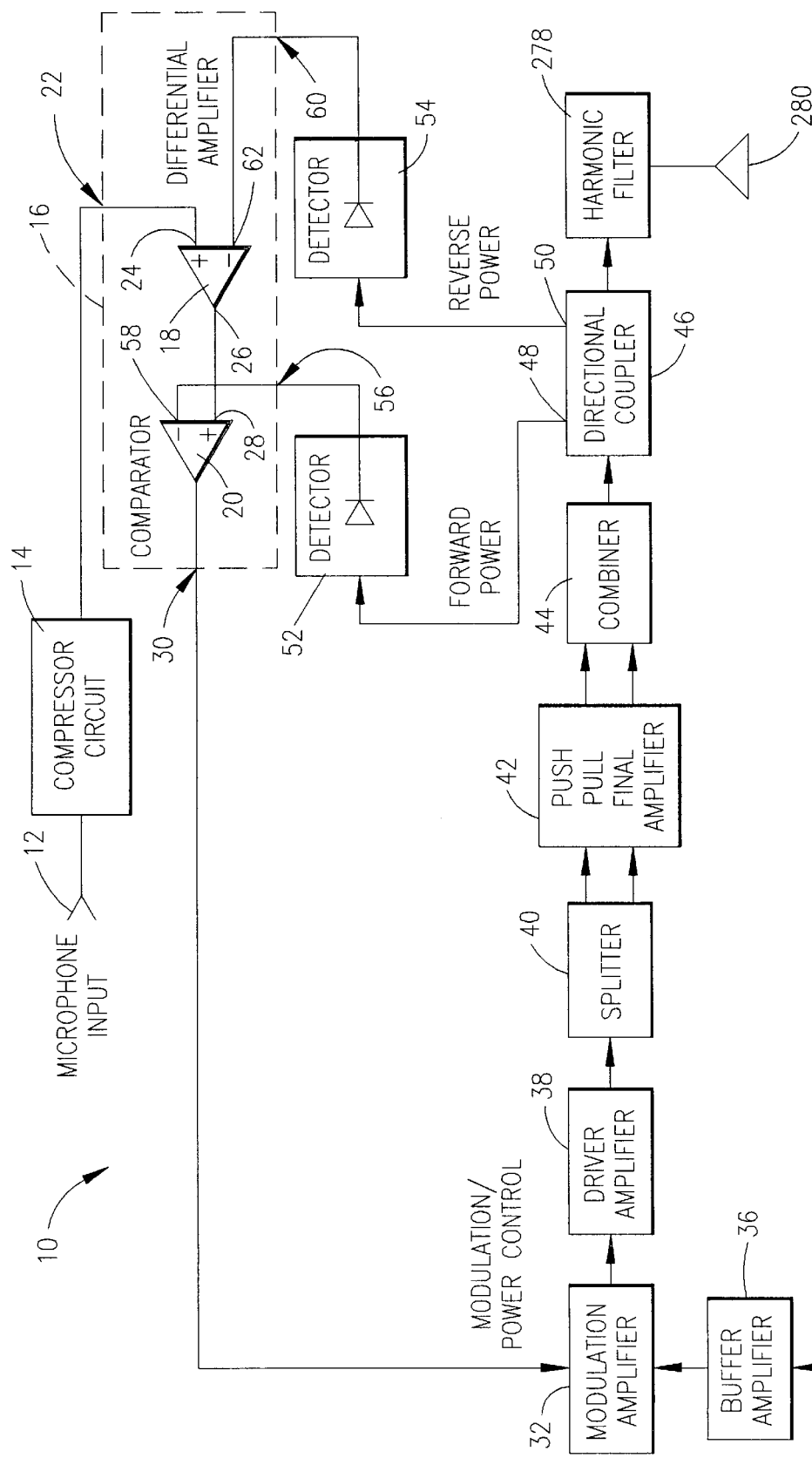
FIG. 1 is a block diagram of the electrical circuitry associated with the transmitter of the present invention.

With reference now initially now to FIG. 1, an AM radio transmitter of the present invention is illustrated in the form of a block diagram, and is represented generally by the reference numeral 10. AM radio transmitter 10 has a microphone input 12 connected to a compressor circuit 14. Compressor circuit 14 is connected to a modulator loop filter, denoted generally by reference numeral 16. As illustrated, modulator loop filter includes a differential amplifier 18 and a comparator 20. Particularly, compressor circuit 14 connects to a first input 22 of the modulator loop filter 16 and, specifically, to a positive input 24 of differential amplifier 18. An output 26 of differential amplifier 18 connects to the positive input 28 of comparator 20. The output 30 of modulator loop filter 16 connects to a modulation and power control circuit, and particularly, a modulation amplifier 32.

The RF source for the modulation amplifier 32 is provided by a conventional phase locked loop (PLL) synthesizer 34. PLL synthesizer 34 connects through a buffer amplifier 36 into modulation amplifier 32. Modulation amplifier 32 outputs into a driver amplifier 38, which in turn outputs into a splitter 40. Splitter 40 splits the AM radio signal to a pair of signals, and outputs the split signals into a push-pull final amplifier 42.

In accordance with the principles of the present invention, splitter 40 is of the type having an unbalanced input and a balanced output configuration. Thus, the AM radio signal enters the unbalanced input of splitter 40 and its output is two balanced output signals. The balanced output signals are fed into the push-pull final amplifier 42, and the two balanced signals are recombined to a single unbalanced output at combiner 44.

The amplified AM radio signal, now recombined at combiner 44, is output from combiner 44 into directional coupler 46. Directional coupler 46 has a forward power port 48 and a reverse power port 50. Directional coupler 46 senses the forward power in the transmitter as well as any reverse power in the transmitter that might be reflected back into the transmitter, due to a poorly mismatched antenna load. The forward power port 48 of directional coupler 46 is connected to a first detector 52. The reverse power port 50 of directional coupler 46 is connected to a second detector 54, as illustrated. The first detector 52 outputs into a second input 56 of modulator loop filter 16 and, specifically, into the negative input 58 of comparator 20. The second detector 54 outputs into a third input 60 of modulator loop filter 16 and, specifically, into the negative input 62 of differential amplifier 18.

Figure 2:
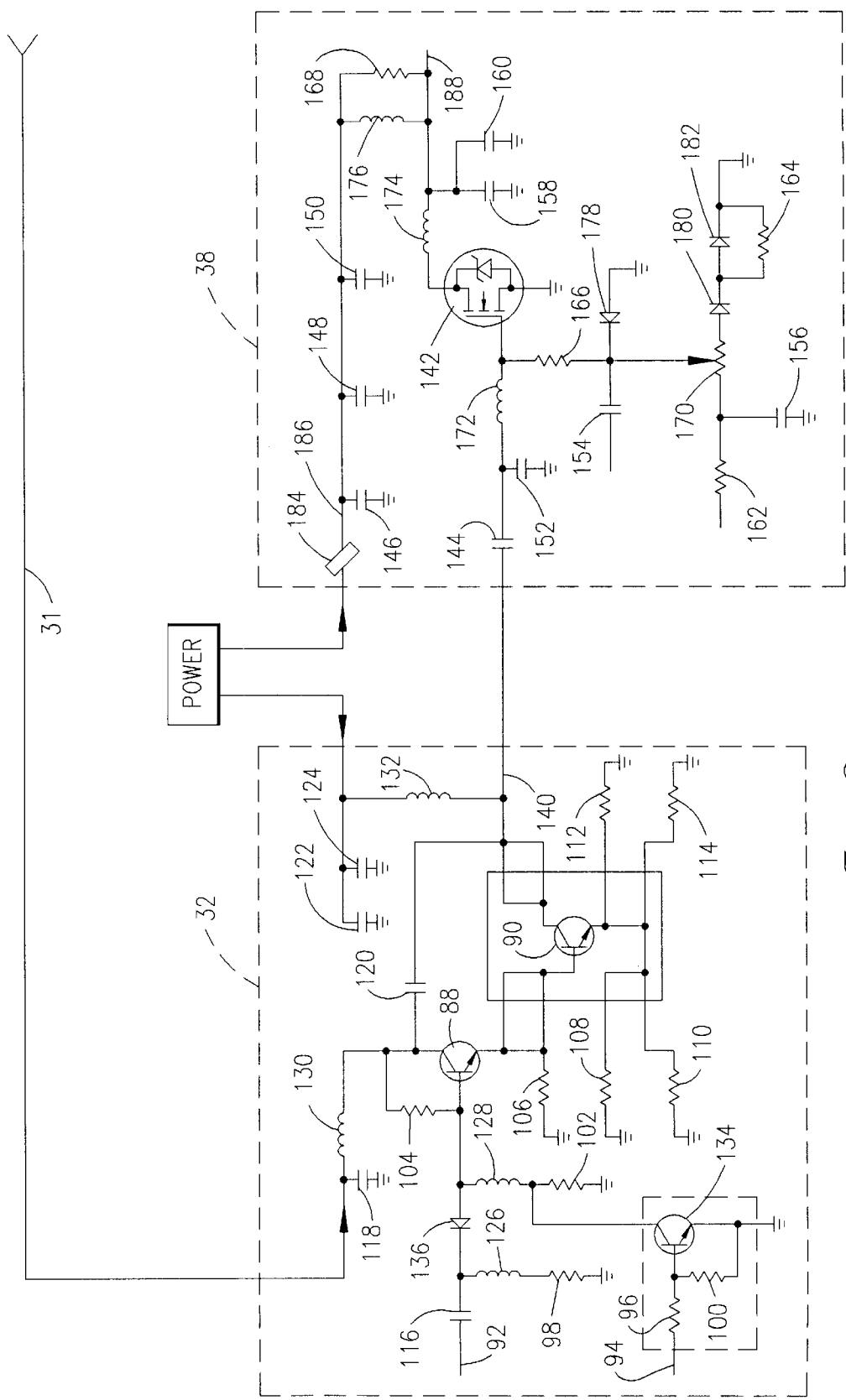
FIGS. 2–3 are schematic diagrams illustrating the electrical circuitry of the audio transmitter of the present invention, and more particularly, illustrating in detail aspects of the block diagram of FIG. 1.
Figure 3:
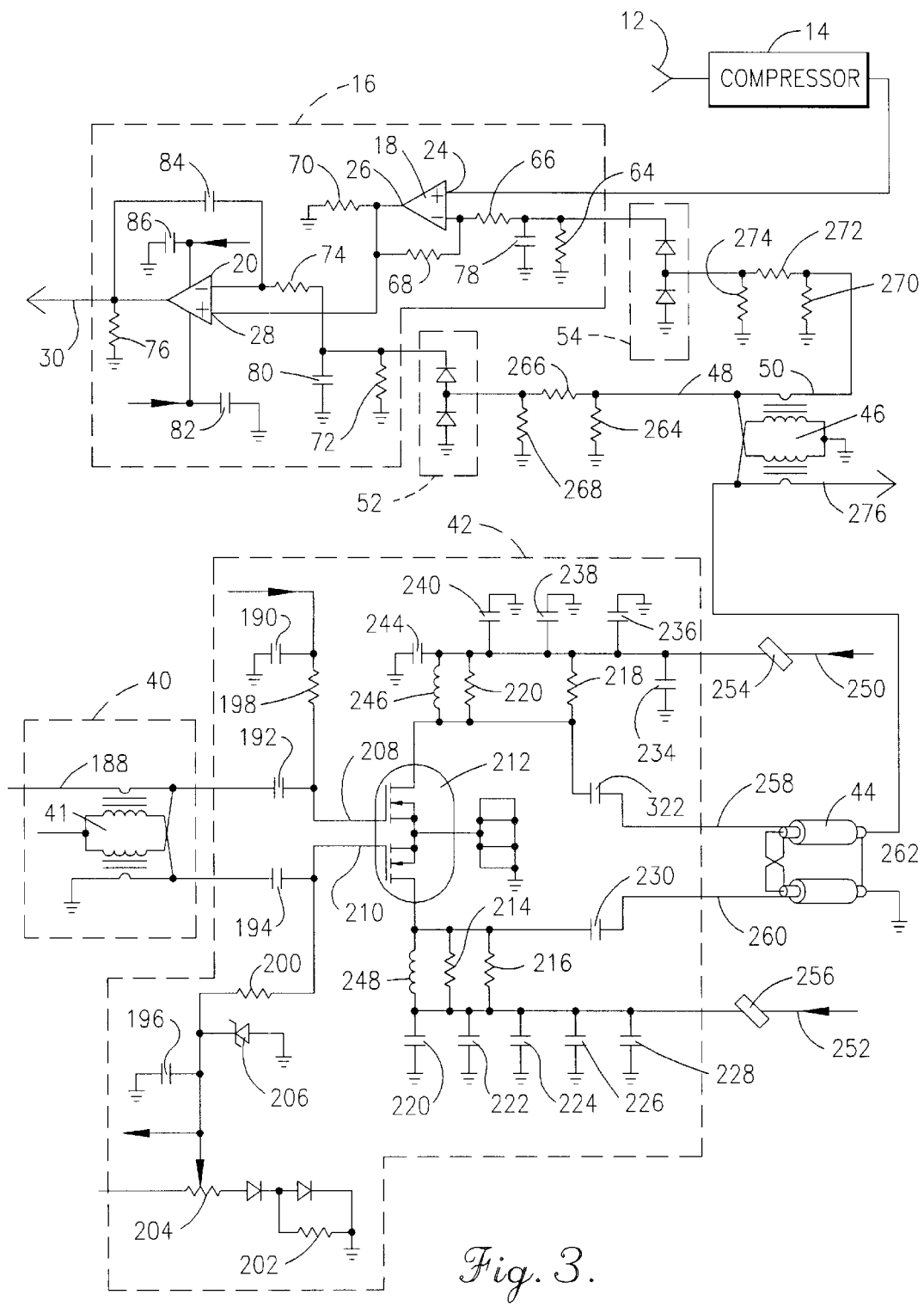

With additional reference now to FIGS. 2 and 3, electrical circuitry associated with transmitter 10 is described in detail.

With reference to FIGS. 2 and 3, microphone input 12 connects to compressor circuit 14. Compressor circuit 14 outputs into modulator loop filter 16 and, particularly, into the positive input 24 of differential amplifier 18. The output 26 of differential amplifier 18 connects to the positive input 28 of comparator 20, as illustrated. Modulator loop filter 16 also includes resistors 64, 66, 68, 70, 72, 74, and 76, connected as shown, as well as capacitors 78, 80, 82, 82, 84, and 86, connected as shown. Output 30 of modulator loop filter 16 and, specifically, comparator 20 outputs the audio signal to modulation amplifier 32. Particularly, the audio signal travels along line 31 to modulation amplifier 32.

Modulation amplifier 32 includes a Darlington RF transistor pair comprised of transistors 88 and 90. Transistor 88 comprises an input stage of the Darlington RF transistor pair, whereas transistor 90 comprises an output stage of the Darlington RF transistor pair. The audio signal enters the input stage of the Darlington RF transistor pair at the collector of transistor 88. Lines 92 and 94 connect to a conventional buffer amplifier 36, as illustrated in FIG. 1. Modulator amplifier 32 further includes resistors 96, 98, 100, 102, 104, 106, 108, 110, 112, and 114, connected as shown, capacitors 116, 118, 120, 122, and 124, connected as shown, inductors 126, 128, 130, and 132, connected as shown, and an additional NPN transistor 134, connected as shown. Additionally, modulation amplifier 32 includes a pin diode 136, forming part of the input stage to the Darlington amplifier transistor pair 88, 90. The Darlington RF transistor pair 88, 90 has an output, designated by reference numeral 140, connected to the collector of NPN transistor 90 of the Darlington RF transistor pair 88, 90. Output 140 carries the modulated radio signal to driver amplifier 38.

Driver amplifier 38 receives the low-level modulated input radio signal from modulation amplifier 32 and drives it to a three watt output power level, in a bias A/B class of operating bias, in a conventional manner. Particularly, driver amplifier 38 includes a MOSFET power transistor 142, capacitors 144, 146, 148, 150, 152, 154, 156, 158, and 160, connected as shown, resistors 162, 164, 166, and 168, connected as shown, variable resistor 170, connected as shown, inductors 172, 174, and 176, connected as shown, diodes 178, 180, and 182, connected as shown, and a ferrite bead 184 and power line 186, as shown.

Driver amplifier 38 outputs on line 188 into splitter 40, consisting of transformer 41. Splitter 40 outputs on lines 208, 210 into push-pull final amplifier 42. Push-pull final amplifier 42 includes a push-pull MOSFET power transistor 212. Push-pull final power amplifier 42, and its associated biasing circuitry, includes resistors 198, 200, 202, 214, 216, 218, and 220, variable re sistor 204, capacitors 190, 192, 194, 196, 222, 224, 226, 228, 230, 232, 234, 236, 238, 240, 242, and 244, inductors 246 and 248, and lever diode 206, all connected as shown. Power lines 250, 252 pass through respective ferrite beads 254, 256, as shown. Push-pull final power amplifier 42, outputs on lines 258, 260 into combiner 44. Combiner 44 outputs on line 262 to directional coupler 46.

Directional coupler 46 receives the output from combiner 44 on line 262, and has a forward power output 48 connected through resistors 264, 266, and 268 to first detector 52. Directional coupler 46 has a reverse power output 50 connected through resistor 270, 272, and 274 to a second detector 54. Directional coupler 46 also has a main power antenna output, designated by reference numeral 276, which passes through a harmonic filter 278 (FIG. 1) to an antenna 280 (FIG. 1).

In operation of AM radio transmitter 10, an operator, such as a pilot or navigator, inputs voice audio into microphone input 12. An audio signal, indicative of the analog voice input into microphone input 12, enters compressor circuit 14. As will be appreciated, the purpose of compressor circuit 14 is to maintain the audio output from compressor circuit 14 at a constant level, regardless of the microphone amplitude or gain, and regardless of the voice amplitude of the person speaking into the microphone connected to microphone input 12. The audio signal, output from compressor circuit 14, enters the modulator loop filter 16, at first input 22 of modulator loop filter 16. Particularly, the audio signal enters the positive input 24 of differential amplifier 18. At differential amplifier 18, the audio input is buffered and, additionally, any audio detected, by detector 54, on reverse power port 50 of directional coupler 46 is subtracted from the audio signal.

The audio signal passes from the output 26 of differential amplifier 18 into the positive input 28 of comparator 20. Comparator 20 compares the algebraic difference between the audio signal, as input from microphone input 12, and any audio that has been detected by detector 52 from the forward power port 48 of directional coupler 46. The modulator loop filter 16 adjusts the audio signal to make any necessary corrections on the output 30 thereof.

The corrected audio signal is conducted along line 31 into modulation amplifier 32. Modulation amplifier 32 is a low level modulation device. The audio signal input into modulation amplifier 32 varies the gain on the input stage of the amplifier, namely, on the input stage of the Darlington RF transistor pair 88, 90, the input stage being comprised of the collector of transistor 88 and pin diode 136. Amplitude modulation is preferably carried out at an input level of approximately plus 7 dBm, which is in the 118–137 MHz range. The RF source for the modulation amplifier is supplied by the phase locked loop synthesizer 34, through buffer amplifier 36. The RF amplitude is controlled by the modulation signal so that the net output from modulation amplifier 32 (e.g., the AM modulated output) enters driver amplifier 38 which drives the modulated radio signal into a power splitter 40. Driver 38 is biased for A/B class of operation. Power splitter 40 is of a type commonly referred to as a balanced/unbalanced device. In this case, an unbalanced RF input is input into splitter 40 and is split into a pair of balanced outputs. Splitter 40 has balanced/unbalanced transformer 41 that takes the single unbalanced input and splits it into two balanced outputs of 180° apart. The balanced outputs are fed into push-pull final amplifier 42.

The push-pull final amplifier 42 produces low even-ordered harmonics, while amplifying the AM radio signal. The two balanced outputs from push-pull final amplifier 42 are input into combiner 44, which combines the two balanced inputs into a single unbalanced output. Combiner 44 also has the function of transforming the impedance of the output device up to 50 ohms. From combiner 44, the combined AM radio signal is input into directional coupler 46. The directional coupler 46 senses both the forward power coming out of the transmitter, and any reverse power that is reflected back to the transmitter due to a poorly mismatched antenna load. The forward and reverse power are output from forward power and reverse power ports 48, 50, respectively, of directional coupler 46. Forward power from the transmitter, output through forward power port 48 of directional coupler 46, is detected by detector 52 and input into the negative input 58 of comparator 20. As previously described, comparator 20 compares the microphone audio signal with the de-modulated audio from the forward power line of directional coupler, and makes any necessary predistortion adjustments of the modulation input envelope to correct out any non-linearities through the transmitter stream. Any reverse power detected by directional coupler 46 is output through reverse power output port 50, and detected by detector 54. The detected reverse power is input into the negative input 62 of differential amplifier 18, for subtracting it from the audio input signal input from microphone input 12, as previously described.

In accordance with an aspect of the present invention, in the event the reverse power exceeds a selected amount due to a mismatch at the antenna port, the actual power and modulation of transmitter 10 is cut back to prevent damage and unstable operation of the final amplifier stage.

The primary output of the directional coupler 46 (e.g., the main transmitter power) is passed through harmonic filter 278, for further reducing any harmonic levels from the transmitter, and the audio signal is then conducted out through the antenna 280.

Thus, transmitter 10 is a transmitting device, particularly suitable for general aviation applications, consisting of a 10 watt transmitter operable in a frequency range of approximately 118–137 MHz. It has a unique push-pull MOSFET base design that produces lower than typical even-ordered harmonics, and therefore has minimal electromagnetic radiation. Transmitter 10 also contains a low level modulating circuit and feedback modulation arrangement which linearizes the modulation of the transmitter, and also senses the reverse power in the transmitter antenna line so that the power and modulation can be cut back if the transmitter has a less than optimal load condition existing on the antenna port.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A transmitter comprising:

a microphone input;

a modulator loop filter, having first, second and third inputs and an output, wherein said first input of said modulator loop filter is connected to said microphone input;

a modulation amplifier, a driver and final amplifier, and a directional coupler in series connection, said modulation amplifier having an input connected to said output of said modulator loop filter, said directional coupler having an antenna output for connecting to an antenna, a forward power output and a reverse power output;

a detector connected to said forward power output of said directional coupler, and to said second input of said modulator loop filter; and a second detector connected to said reverse power output of said directional coupler, and to said third input of said modulator loop filter.

2. A transmitter as set forth in claim 1, wherein said final amplifier includes a push-pull MOSFET power transistor.

3. The transmitter as set forth in claim 2, further comprising:

a driver amplifier and a splitter coupled in series between said modulation amplifier and said final amplifier; and a combiner coupled between said final amplifier and said directional coupler.

4. The transmitter as set forth in claim 3, further comprising:

a synthesizer connected to said modulation amplifier.

5. The transmitter as set forth in claim 4, further comprising:

a buffer amplifier, wherein said buffer amplifier is connected between said synthesizer and said modulation amplifier.

6. The transmitter as set forth in claim 5, further comprising:

a compressor circuit coupled between said microphone input and said modulator loop filter; and a harmonic filter coupled to said antenna output of said directional amplifier, said harmonic filter for coupling with an antenna.

7. The transmitter as set forth in claim 2, wherein said transmitter is a VHF transmitter operable in a frequency range of approximately 118 MHz to 137 MHz.

8. The transmitter as set forth in claim 2, further comprising:

an antenna coupled to said directional coupler, wherein an AM radio signal indicative of audio input into said microphone is output from said antenna, and wherein said push-pull MOSFET transistor produces minimal even-order harmonics in said radio signal.

9. The transmitter as set forth in claim 1, wherein said modulation amplifier comprises:

a Darlington RF transistor pair circuit.

10. The transmitter as set forth in claim 9, wherein an audio signal indicative of audio input at said microphone input modulates a radio signal by varying a bias of said Darlington RF transistor pair.

11. The transmitter set forth in claim 10, said Darlington RF transistor pair further comprising:

an input stage, including a collector; and an output stage, wherein a voltage on said collector of said input stage is varied to modulate said radio signal.

12. The transmitter as set forth in claim 11, wherein said input stage of said Darlington RF transistor pair further comprises:

a pin diode having a bias, wherein said bias of said pin diode is varied by said audio signal, thereby changing attenuation characteristics of said audio signal.

13. The transmitter as set forth in claim 1, wherein said second detector detects reverse power output from said directional coupler, wherein modulation of said radio signal is reduced when said reverse power reaches a selected level.

* * * * *